United States Patent
Nettleton et al.

(10) Patent No.: US 7,068,699 B2
(45) Date of Patent: Jun. 27, 2006

(54) MULTI-FUNCTION COMBAT LASER FOR THE DISMOUNTED SOLDIER

(75) Inventors: John E. Nettleton, Fairfax Station, VA (US); Dallas N. Barr, Woodbridge, VA (US); Jonathan S. Lei, Springfield, VA (US)

(73) Assignee: The United States of America as represented by the Department of the Army, Washington, DC (US)

( * ) Notice: Subject to any disclaimer, the term of this patent is extended or adjusted under 35 U.S.C. 154(b) by 0 days.

(21) Appl. No.: 10/839,451

(22) Filed: Apr. 29, 2004

(65) Prior Publication Data

US 2005/0243885 A1 Nov. 3, 2005

(51) Int. Cl.
*H01S 3/08* (2006.01)
*G02B 27/14* (2006.01)
*G02B 27/12* (2006.01)

(52) U.S. Cl. ............... 372/92; 372/108; 359/629; 359/634; 359/639

(58) Field of Classification Search .......... 372/92, 372/98, 99, 108, 109; 359/618, 629, 634, 359/639
See application file for complete search history.

(56) References Cited

U.S. PATENT DOCUMENTS

| | | | | |
|---|---|---|---|---|
| 5,228,050 A | * | 7/1993 | LaCourse et al. | 372/50 |
| 5,930,030 A | * | 7/1999 | Scifres | 359/341.3 |
| 6,005,718 A | * | 12/1999 | Park et al. | 359/627 |
| 6,139,157 A | * | 10/2000 | Okuyuma | 353/102 |
| 6,226,126 B1 | * | 5/2001 | Conemac | 359/618 |
| 6,256,327 B1 | * | 7/2001 | Goldberg | 372/22 |
| 2002/0075909 A1 | * | 6/2002 | Kasamatsu et al. | 372/6 |
| 2003/0219055 A1 | * | 11/2003 | Chua et al. | 372/50 |

* cited by examiner

*Primary Examiner*—Thuy V. Tran
*Assistant Examiner*—Leith A. Al-Nazer
(74) *Attorney, Agent, or Firm*—Andrew Romero

(57) ABSTRACT

A multi-function combat laser is described that uses single or multiple laser sources (laser diodes) in a configuration such that when it is coupled with a dichroic substrate the laser sources outputs are coupled to produce a single desired output. The multi-function combat laser consolidates multiple laser functions for the dismounted soldier into a single package with shared power supplies, optics and laser sources.

4 Claims, 2 Drawing Sheets

US 7,068,699 B2

MULTI-FUNCTION COMBAT LASER FOR THE DISMOUNTED SOLDIER

GOVERNMENT INTEREST

The invention described herein may be manufactured, used, sold, imported, and/or licensed by or for the Government of the United States of America.

FIELD OF INTEREST

This invention relates to consolidating multiple laser functions for the dismounted soldier into a single package with shared power supplies, controls, optics and laser sources.

BACKGROUND OF THE INVENTION

The U.S. Army will continue to employ its dismounted forces to conduct both full-scale combat operations and operations other than war. The modern dismounted soldier must carry everything he needs to survive in a combat environment and is thus, overburdened. Therefore, any additional weight to be worn or carried must provide substantial added benefit.

The U.S. Army currently fields several laser devices to aid in combat missions and in training exercises. For example, the PAQ-4 is a precision laser-aiming device that projects a laser spot that is visible, with night vision goggles, up to a kilometer away. The Multiple Integrated Laser Engagement System (MILES) is a weapon simulation system used by the Army to simulate realistic combat environments. The Army has also developed the Miniature Eye safe Laser Infrared Observation Set (MELIOS) laser range finder for use by the individual soldier.

There are many more examples of laser devices that are used in the Army but it is the function they are providing that is important and these functions are:

NIR precision aiming
VIS precision aiming
VIS bore sighting
NIR illumination
Weapon simulation
Range finding
Combat identification.

All of these functions require that the dismounted soldier carry several different types of lasing systems all have unique requirements and power supplies. Therefore, there is a need to reduce the number of lasing systems that the dismounted soldier carries. This invention addresses this need.

SUMMARY OF THE INVENTION

Accordingly, one object of the present invention is to consolidate multiple eye safe functions for the dismounted soldier into a single package with shared power supplies, controls, optics and laser sources thus minimizing the claim on weight, space and power for the dismounted soldier.

This and other objects of the present invention are achieved by using single or multiple laser sources (laser diodes) in a configuration such that when it is coupled with a dichroic substrate the laser sources outputs are coupled to produce a single desired output. For example, the present invention is more specifically achieved by having at least a first, second and third laser output means and at least a first and second dichroic substrates placed in series with a lens wherein the lens projects a combination of the outputs of the first, second and third laser output means and wherein the outputs of the first and second laser output means are combined via the first dichroic substrate and the combination of the first and second laser outputs is combined with the output of the third laser output means via the second dichroic substrate. Typically, dichroic substrates are used to split optic outputs. However, in the present invention, they are used in sequence to combine the power output of the laser diodes.

BRIEF DESCRIPTION OF THE DRAWINGS

These and other objects of the invention will become readily apparent in light of the Detailed Description Of The Invention and the attached drawings wherein.

DETAILED DESCRIPTION OF THE INVENTION

Figure 1:
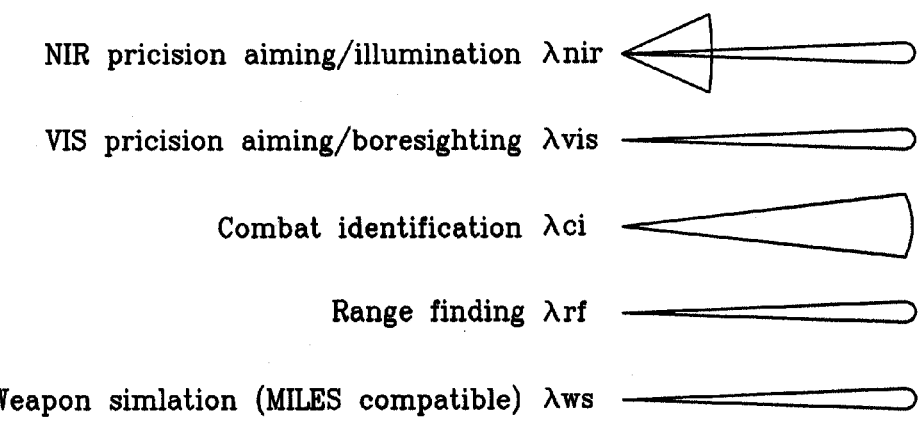
FIG. 1 illustrates the relative beam divergence of various laser applications at differing wavelengths.

The present invention consists of a single, eye safe compact laser device that is capable of providing any combination or all of the laser functions shown in FIG. 1. This invention consolidates multiple laser functions for the dismounted soldier into a single package with shared power supplies, controls, optics and laser sources thus, minimizing the claim on weight, space and power for the dismounted soldier. The relative beam divergence at possible differing wavelengths of this Multi-Function Combat Laser (MFCL) is pictured in FIG. 1. Note that the multiple wavelengths with different beam divergence are emitted from a single, common aperture. The same wavelength may be used to perform different functions. For example, the NIR laser wavelength may be used for a combination of precision aiming and illumination, with night vision goggles, and for weapon simulation, with MILES.

Figure 2:
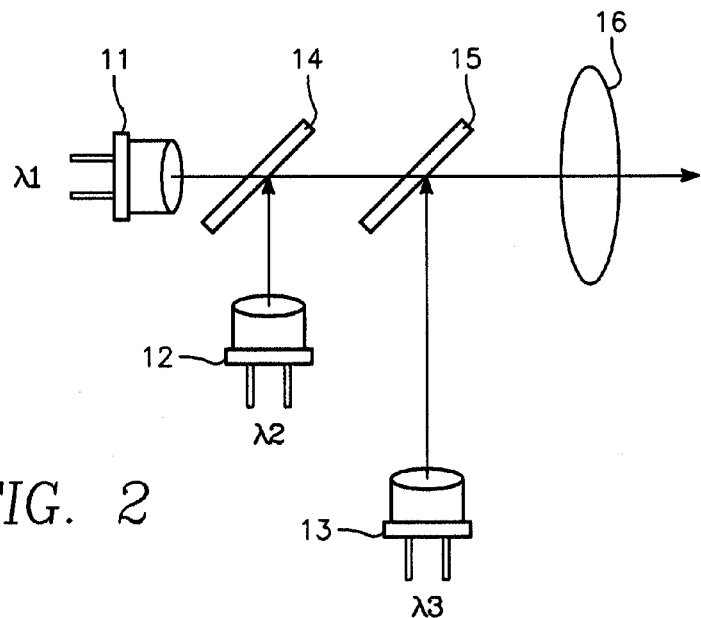
FIG. 2 illustrates an embodiment of the present invention in a "rack and stack" configuration utilizing discrete components.
Figure 3:
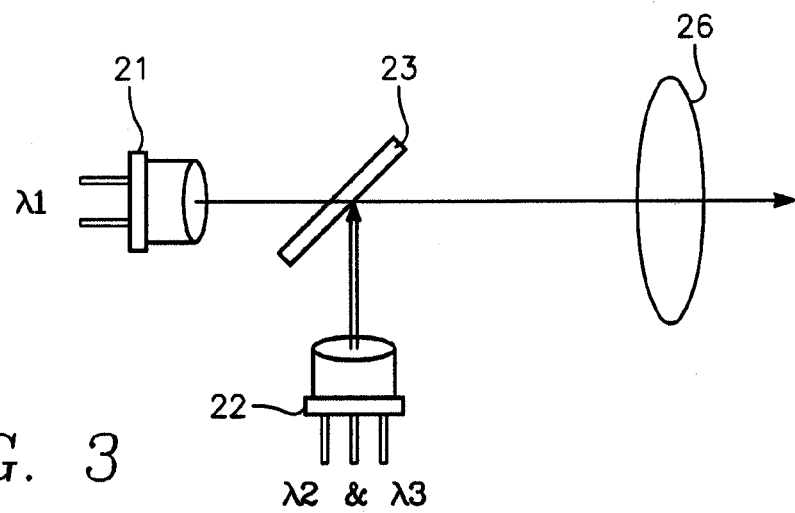
FIG. 3 illustrates an embodiment of the present invention in a multi-wavelength CW laser diode optical layout.
Figure 4:
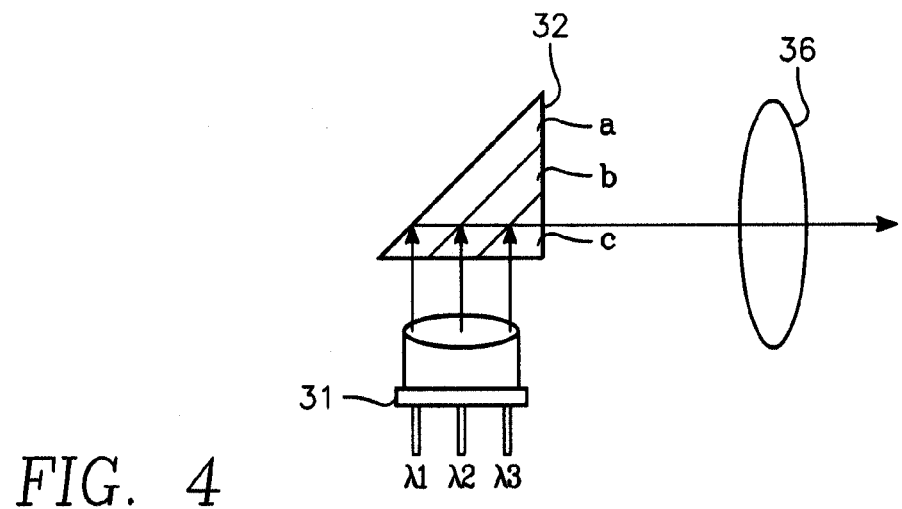
FIG. 4 illustrates an embodiment of the present invention in a multi-wavelength integrated laser diode optical layout.

The optical layouts, utilizing a combination of laser diodes and dichroic substrates, for the MFCL according to the present invention are depicted in FIGS. 2, 3 and 4. FIG. 2 is a "rack and stack" method utilizing discrete components and thus, claims more space and weight. As shown in FIG. 2, three laser sources 11, 12, and 13 are used in series and there output is combined by 2 dichroic substrates 14 and 15. Laser source 11 of wavelength λ1 is combined with the output of laser 12 of wavelength λ2. These two outputs are then combined with the output of laser source 13 λ3 with dichroic substrate 15. The combined output of all three laser sources is then project via lens 16.

The optical layout of the present invention pictured in FIG. 3 integrates the output of two continuous wave (CW) type laser diodes λ2 and λ3 into common laser source 22 to save on size and components. The output of combined laser diode 22 is further combined with the output of laser source 21 λ1 through dichroic substrate 23. This combined output is then projected via lens 26.

Finally, FIG. 4 shows a wholly integrated, modular laser diode package with all laser wavelengths in the same package. As shown, an integrated laser diode 31 produces three outputs λ1, λ2, and λ3. These outputs are projected onto an integrated dichroic substrate 32 having 3 different substrates positioned such that substrate a projects output λ1 onto substrate b projects output λ2, and this combined output is projected on to substrate c which combines outputs λ1 and λ2 with output λ3. This combined output is then projected via lens 36.

Besides weight and size savings, the smaller laser package also has the benefit of requiring smaller mechanical bore sight adjusters to register and maintain bore sight. It is noted that micro-lasers may replace the combat identification and visible aiming laser diodes for possible performance enhancement. The range finder function requires a receiver channel to detect the returning laser energy. This optical channel can be integrated into the transmit leg (using polarization switching techniques) or it can be a separate leg with its own receive aperture.

The present invention consolidates multiple eye safe functions for the dismounted soldier into a single package with shared power supplies, controls, optics and laser sources thus minimizing the claim on weight, space and power for the dismounted soldier. The MFCL has the additional benefit of being a piece of equipment the soldier can train with as well as take into combat . . . a true, fight as he trains, train as he fights capability.

The present invention may be used by soldiers in conjunction with simulated combat scenarios for realistic training and in actual combat giving the soldier added combat capabilities while minimizing his load.

What is claimed is:

1. A multi-function combat laser source comprising:
at least first, second and third laser output means,
at least first and second dichroic substrates placed in series;
a shared lens placed in series with the first and second dichroic substrates; and
shared power supplies and controls for the first, second and third laser output means;
wherein the lens projects a combination of the outputs of the first, second and third laser output means;
wherein the outputs of the first and second laser output means are combined via the first dichroic substrate and the combination of the first and second laser outputs is combined with the output of the third laser output means via the second dichroic substrate; and
wherein the projected outputs of the first, second and third laser output means have different beam divergence.

2. A multi-function combat laser source comprising:
at least first and second laser output means,
dichroic substrates placed in series;
a lens placed in series with the dichroic substrates; and
shared power supplies and controls for the first and second laser output means;
wherein the second laser output means produces two different continuous wave forms;
wherein the lens projects a combination of the outputs of the first and second laser output means;
wherein the outputs λ1, λ2, and λ3 of the first and second laser output means are combined via the dichroic substrates; and
wherein the projected outputs λ1, λ2, and λ3 of the first and second laser output means have different beam divergence.

3. A multi-function combat laser source comprising:
an integrated laser output means which is an integration of a first, second, and third laser output means having three different outputs λ1, λ2, and λ3,
an integrated dichroic substrate having at least a first, second and third subtrates all three placed in series;
a lens placed in series with the integrated dichroic substrate; and
shared power supplies and controls for the integrated laser output means;
wherein the outputs λ1, λ2, and λ3 of the integrated laser output means are combined via the integrated dichroic substrate; and
wherein the outputs λ1, λ2, and λ3 of the integrated laser output means have different beam divergence.

4. The multi-function combat laser source of claim 3 wherein the integrated dichroic substrate is situated such that it combines outputs λ1, λ2, and λ3 in series with the first, second and third substrates.

* * * * *